United States Patent
Vasilantone

(10) Patent No.: US 9,184,328 B1
(45) Date of Patent: Nov. 10, 2015

(54) SOLAR PANEL ENCLOSURE UNIT

(71) Applicant: Michael M. Vasilantone, Lakewood, NJ (US)

(72) Inventor: Michael M. Vasilantone, Lakewood, NJ (US)

(*) Notice: Subject to any disclaimer, the term of this patent is extended or adjusted under 35 U.S.C. 154(b) by 0 days.

(21) Appl. No.: 14/120,154

(22) Filed: May 1, 2014

(51) Int. Cl.
*H01L 31/042* (2014.01)
*H01L 31/054* (2014.01)
*H02S 20/30* (2014.01)
*H02S 40/22* (2014.01)

(52) U.S. Cl.
CPC .......... *H01L 31/0543* (2014.12); *H01L 31/042* (2013.01); *H02S 20/30* (2014.12); *H02S 40/22* (2014.12); *H02S 20/00* (2013.01); *Y02E 10/52* (2013.01)

(58) Field of Classification Search
CPC .............. H01L 31/0524; H01L 31/042; H01L 31/0543; H02S 20/30; H02S 20/00; H02S 40/22

USPC ............................................ 136/246, 244, 251
See application file for complete search history.

(56) References Cited

U.S. PATENT DOCUMENTS

| | | | | |
|---|---|---|---|---|
| 1,421,506 | A | * | 7/1922 | Limpert ........................ 362/291 |
| 4,116,223 | A | * | 9/1978 | Vasilantone .................. 126/643 |
| 2009/0084431 | A1 | * | 4/2009 | Briee et al. .................... 136/246 |
| 2010/0126555 | A1 | * | 5/2010 | Maxton ......................... 136/246 |
| 2011/0253214 | A1 | * | 10/2011 | Chung ........................... 136/259 |

* cited by examiner

*Primary Examiner* — Allison Bourke
(74) *Attorney, Agent, or Firm* — Clifford G. Frayne

(57) ABSTRACT

A solar energy enclosure unit having a housing defining a central cavity in which there is located a turntable upon which is mounted a solar panel; the turntable and solar panel rotated at low revolutions per minute by an associated electric motor, the enclosure having a convex transparent dome covering the solar panel, the transparent convex dome having prismatic facets formed thereon for magnifying, concentrating, and focusing solar rays onto the solar panel regardless of the position of the sun, in the sky, relative to the housing.

2 Claims, 4 Drawing Sheets

SOLAR PANEL ENCLOSURE UNIT

BACKGROUND OF THE INVENTION

1. Field of the Invention

The present invention relates to a solar energy unit, and more particularly to a solar panel unit housed within a cavity covered by a transparent dome, which dome magnifies and centralizes solar rays on the solar panel concentrating the solar rays on the solar panel regardless of the suns position in the sky relative to the housing.

2. Description of the Prior Art

Since the advent of the so called "global warming" theory, there has been a great deal of effort and thought put into alternative energy sources and the weaning of the populous from fossil fuels and carbon energy sources for the sake of the atmosphere. This has led to recent developments in efficiencies associated with solar energy panels which convert solar rays into electricity for not only industrial use, but residential use. It is not unusual to drive down any residential street and see solar panels mounted on the roofs of houses gathering solar rays and converting it to electrical energy either for the home owner's direct use, or for direction to the electrical grid of the local area. Additionally, depending upon space, large solar panel farms are erected by industry, including the power companies to take advantage of this free energy.

The one draw back to solar panels is that they must be mounted in such a position or location to take advantage of solar rays as the sun traverses the sky. Therefore as the sun moves throughout the day, the solar panel becomes less efficient in collecting solar rays. Recent developments have led to improved efficiencies in solar panels, but this positioning of the solar panel remains an axiom of their use.

One of the primary purposes of this invention is to provide for a solar energy unit which incorporates a solar panel which is mounted on an adjustable rate turn table and is covered by a hemispherical transparent dome which is provided with prismatic facets so as to magnify and concentrate solar rays onto the rotating solar panel. In this manner, any light hitting the dome despite the time of day and positioning of the sun will be intensified and focused onto the rotating solar panel within the enclosure. The solar panels rotating within the enclosure would be in communication with the appropriate electrical circuitry to transfer the electrical energy generated to the appropriate appliance or electrical grid.

OBJECTS OF THE INVENTION

An object of the present invention to provide for a solar energy enclosure unit in which a solar panel is positioned and which is covered by a convex, transparent dome exposed to the sun at any relative position in the sky, the dome having prismatic facets to concentrate solar rays onto the solar panel.

A still further object of the present invention is to provide a solar energy enclosure unit in which the solar panel within the unit is mounted on a rotatable turntable.

A further object of the present invention is to provide for a solar energy enclosure unit in which the solar panel within the enclosure is segmented into various pie shaped sizes.

A further object of the invention to provide for a solar energy unit which may be adapted to any existing building or be mounted separately from a building in an open area.

A still further object of the present invention is to provide for a solar energy enclosure unit which may be readily and inexpensively manufactured.

SUMMARY OF THE INVENTION

A solar energy enclosure unit having a housing defining a central cavity in which there is located a turntable upon which is mounted a solar panel; the turntable and solar panel rotated at low revolutions per minute by an associated electric motor, the enclosure having a convex transparent dome covering the solar panel, the transparent convex dome having prismatic facets formed thereon for magnifying, concentrating, and focusing solar rays onto the solar panel regardless of the position of the sun, in the sky, relative to the housing.

BRIEF DESCRIPTION OF THE DRAWINGS

These and other objects of the present invention will become apparent, particularly when taken in light of the following illustrations wherein.

DETAILED DESCRIPTION OF THE INVENTION

Figure 1:
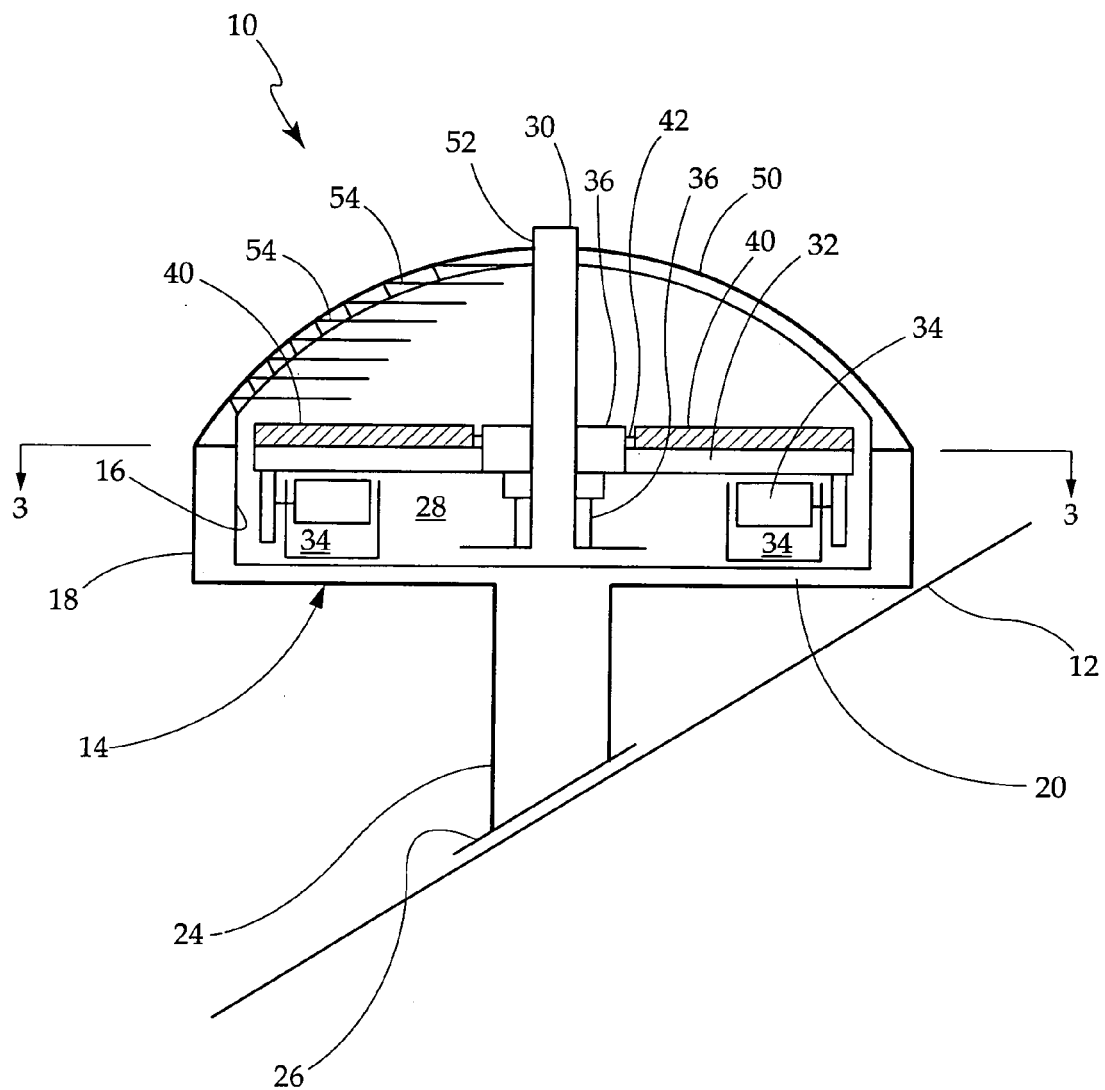
FIG. 1 is a cross sectional view of the solar energy enclosure unit of the present invention taken along lines 1-1 of FIG. 2.
Figure 2:
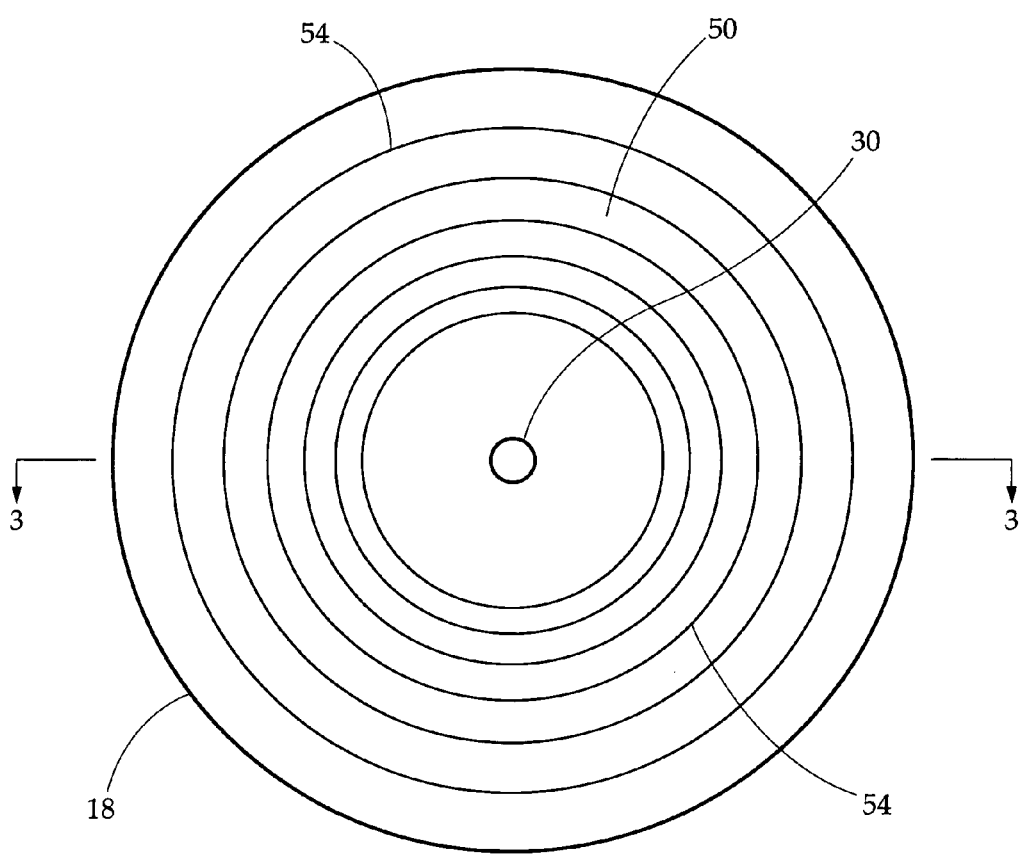
FIG. 2 is a top plan view of the solar energy enclosure unit of the present invention.

Referring now to the drawings wherein like numerals indicate like parts, the solar panel enclosure unit of the present invention is generally indicated by the numeral 10 and FIG. 1 illustrates a cross sectional view of the unit taken along Plane 1-1 of FIG. 2, which is a top plan view of the solar energy enclosure unit 10. For purposes of explanation, the unit 10 as illustrated in FIG. 1 is mounted on a sloped roof 12 as depicted by roof line 12.

The lower housing 14 contains circumferential wall having an inner circumferential surface 16, an outer circumferential surface 18 and a base 20. The underside of base 20 has a downwardly depending mounting member 24 secured to roof 12 by means of bracket 26. Inner circumferential surface 16, outer circumferential wall 18, and base 20 define a cavity 28 which has an upstanding central pole 30 which extends above the depth of the cavity defined by the circumferential side wall.

Mounted in a horizontal plane proximate the top of the side wall of cavity 28, is a circular planar turntable 32 which revolves about central pole 30. Turntable 32 is driven by one or more electric motors 34 positioned within cavity 28 beneath turntable 32. Mounted on turntable 32 and juxtaposed to central pole 30, are a plurality of electrical receptacles 36. These electrical receptacles are designed to receive the contacts from the solar panels and to provide communication from those contacts to an appropriate electrical appliance or electrical grid through central pole 30 and mounting member 24.

Mounted onto the upper surface 38 of turntable 32 are a plurality of solar panels 40 having contact ends 42 in communication with receptacles 36.

It will be recognized by those skilled in the art that the design thus far describes a cavity 28 having a circular configuration, and thus cooperable with a turntable 32 having a circular configuration. The solar panels 40 positioned on the upper surface of turntable 32 would optimally be pie-shaped solar panels to optimize the coverage, and as more fully explained with respect to the description of FIG. 3 hereafter.

The cavity 28 is covered by a transparent dome 50 which is secured to the upper surface 52 of the side wall of cavity 28.

The transparent dome 50 is formed with a central aperture 52 at its apex to accommodate the upwardly extending pole 30 which provides added stability to the transparent dome 50 when secured to the housing.

The transparent dome 50 is formed with prismatic facets 54 for magnifying, concentrating and focusing solar rays onto the rotating solar panels 40 within the housing 10 regardless of the position of the sun in the sky relative to the solar panel enclosure unit. The prismatic facets could be unitary with the transparent dome, such as a Fresnel lens, or the prismatic facets may be applied in the form of a transparent foil or the like to the surface of the dome to accomplish the same magnification, concentration and focusing.

FIG. 2 is a top plan view of the solar panel enclosure unit 10 of the present invention illustrating the circularity of its construction and illustrating the prismatic facets 54 associated with the transparent dome 50. The diameter of the solar panel enclosure unit may vary. One consideration regarding size would be the weight of the unit as the diameter expands the ability to support the unit with support member 24. Possible solutions would be to provide multiple support members. Additionally, while the unit has been illustrated with respect to a roof mount in FIG. 1, the unit could also be mounted on the ground or elevated from the ground in an open area in which case multiple support members might be used and the diameter of the unit could be expanded significantly and also the concomitant area of the enclosed solar panels.

Figure 3:
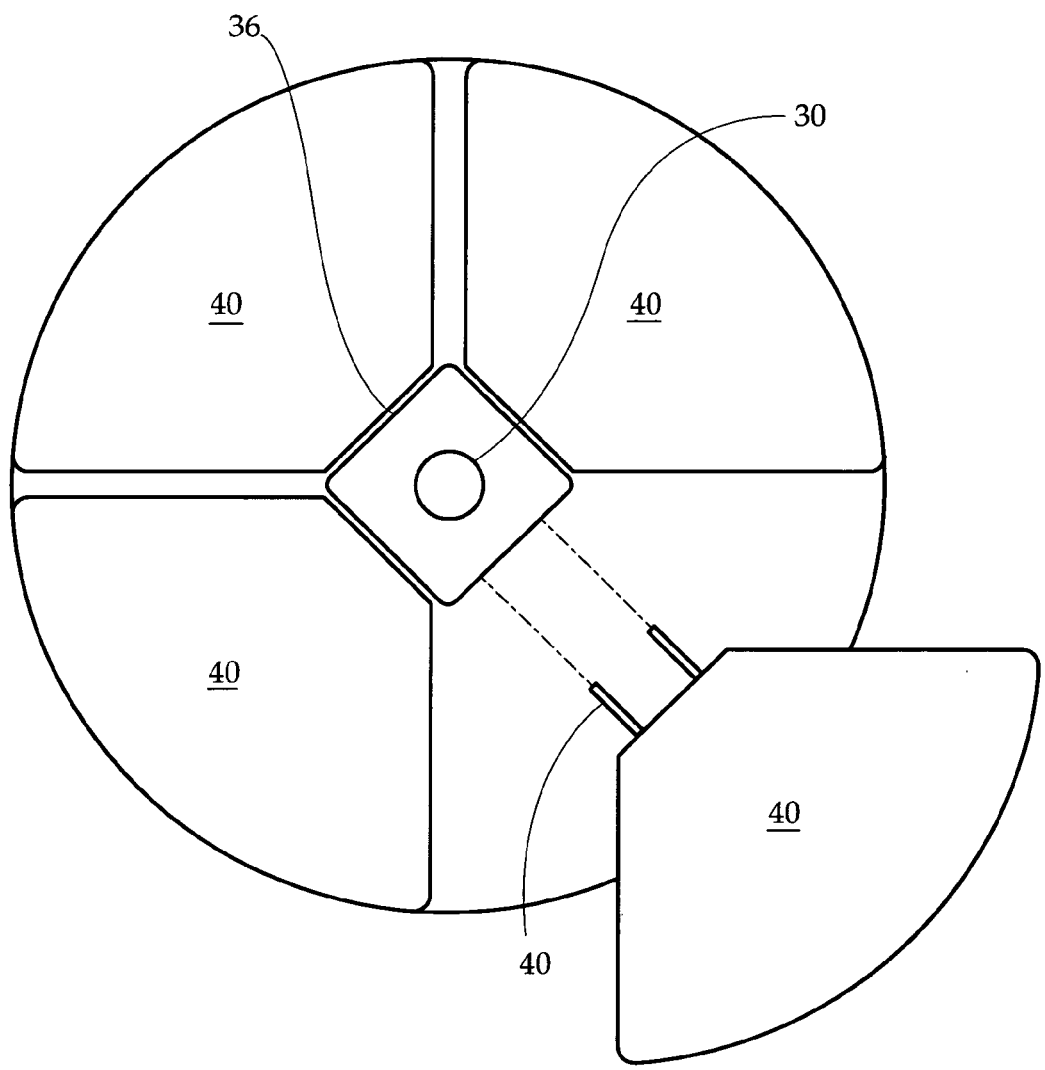
FIG. 3 is a plan view of the solar panel and turntable on the interior of the solar energy enclosure unit along Plane 3-3 of FIG. 1.

FIG. 3 illustrates a plan view of the solar panel and turntable on the interior of the solar panel enclosure unit along Plane 3-3 of FIG. 2. Central pole 30 extends vertically upwardly in the center of the cavity 28 passing through turntable 32 and having mounted circumferentially thereon a receptacle 36. As illustrated in FIG. 3, the solar panel segments are pie-shaped and number four in the illustration. Each panel 40 has a male connector 42 at its inner most edge, receivable within a female connection in the receptacle. In this illustration there are four pie-shaped solar panels, so there are four sides to receptacle 36, and there would be four female receptacle units. If the number of pie-shaped panels increased, receptacle 36 would then become a polyhedron of more than four sides to accommodate the number of pie-shaped solar panels, each side of receptacle 36 having a female receptor for panels, each side of receptacle 36 having a female receptor for receipt of the male connection on each of the pie-shaped solar panels.

Figure 4:
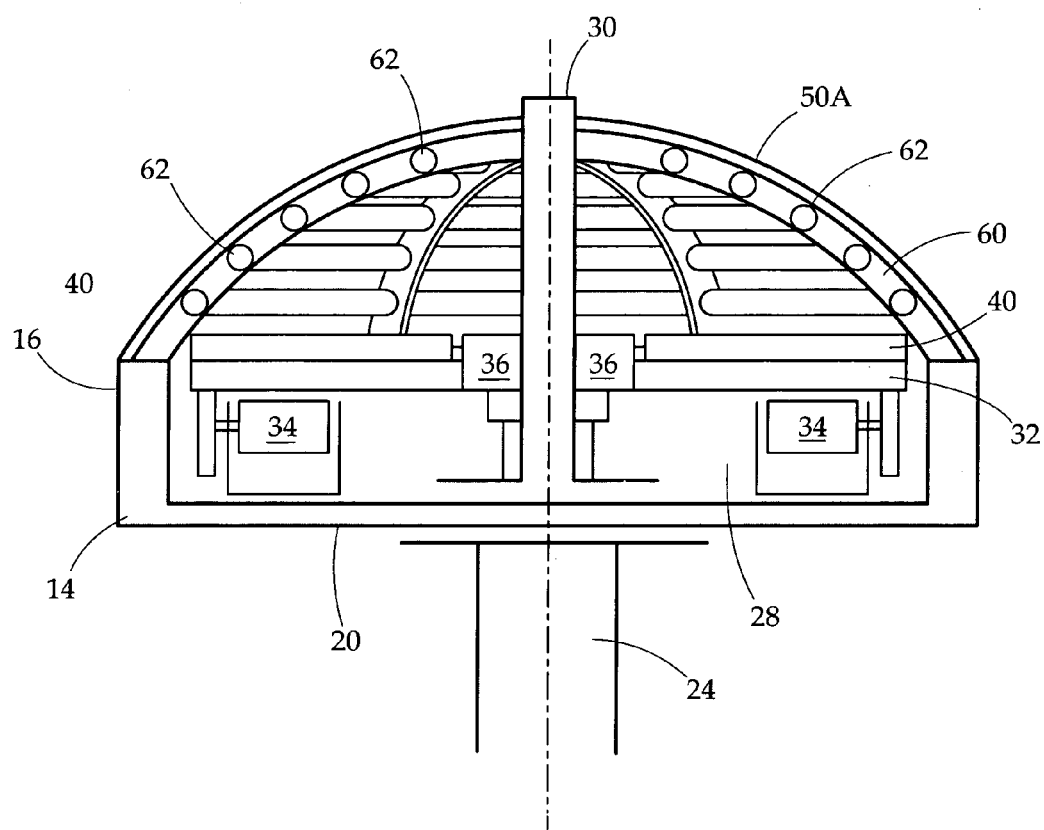
FIG. 4 is a cross sectional view of the enclosure unit illustrating a second embodiment of the dome and prismatic facets.

FIG. 4 is a cross sectional view of a second embodiment of the solar energy enclosure unit 10. This second embodiment is substantially identical to the first embodiment as illustrated in FIGS. 1, 2, and 3, in that it contains a lower housing 14, a circumferential wall having a circumferential surface 16, a base 20, and a depending mounting member 24. There is mounted in the housing a circular planar turntable 32 revolving around a central pole 30 within cavity 28, turntable 32 being driven by one or more electric motors 34. Electrical receptacle 36 is juxtaposed the central pole 30. Identical solar panels 40 are mounted on the upper surface of the turntable.

The difference with respect to the second embodiment is that the stepped prismatic dome or fresnal dome as illustrated in FIG. 1, is replaced by transparent dome 50A secured in the same manner as that of FIG. 1. However, there is disposed within dome 50A a lattice work 60 comprised of arched supports extending upwardly from the side wall of housing 14 to form a circular aperture through which central pole 30 extends. This lattice work supports a plurality of prismatic rings 62 extending about the lattice work in decreasing concentric circles from the portion of the lattice work having the widest diameter to the upper portion having the smallest diameter.

The prismatic rings 62 will serve the same purpose as focusing and magnifying the solar rays onto the solar panels. However, this form of construction would be less expensive than a fresnal dome, and would provide more flexibility in order to provide the ability to select the features that are available and more desirable to a particular user and location.

It is well known that heat in the form of solar rays can possibly cause damage to solar panels if their focus on the panel is intensive and continuous. Hence the reason for the turntable mount of the solar panels of the instant invention. To further lessen the possibility of any solar heat damage to the solar panels, the transparent dome may be fabricated with a coating to reflect the heat rays of the sun, but allow those rays to initiate the solar panels to pass there through.

Therefore, while the present invention has been disclosed with respect to the preferred embodiments thereof, it will be recognized by those of ordinary skill in the art that various changes and modifications can be made without departing from the spirit and scope of the invention. It is therefore manifestly intended that the invention be limited only by the claims and the equivalence thereof.

I claim:

1. A solar panel enclosure unit for optimizing the gathering of solar rays and improving the efficiency of the solar panel, the unit comprising a housing having a central cavity, said central cavity having positioned therein a rotatable turntable and control and power means for rotating said turntable and controlling the rate of rotation, a plurality of solar panels mounted directly on said turntable, said solar panels in communication with a receptacle centrally positioned on said turntable for passage of electrical current, a transparent dome mounted on said housing and covering said cavity; a hemispherical structural lattice supporting a plurality of upwardly decreasing diameter concentric prismatic rings, the hemispherical structural lattice and upwardly decreasing diameter concentric prismatic rings being positioned within said transparent dome.

2. The solar panel enclosure unit in accordance with claim 1 wherein said plurality of solar panels are triangular in shape having a curved base and positioned in a pie-shape arrangement on said turntable, each of said solar panels in communication with said receptacle centrally positioned on said turn table for passage of electrical current and arranged in a horizontal orientation on said turn table.

* * * * *